United States Patent [19]
Ondria

[11] Patent Number: 4,890,074
[45] Date of Patent: Dec. 26, 1989

[54] QUARTZ MICROSTRIP GUNN OSCILLATOR

[75] Inventor: John Ondria, Nettleham, England

[73] Assignee: Marconoi Electronic Devices Limited, England

[21] Appl. No.: 308,838

[22] Filed: Feb. 9, 1989

[30] Foreign Application Priority Data

Feb. 8, 1989 [GB] United Kingdom ............... 8902767

[51] Int. Cl.$^4$ ............................................. H03B 9/12
[52] U.S. Cl. ........................... 331/107 SL; 331/177 V
[58] Field of Search ............. 331/96, 99, 101, 107 SL, 331/107 G, 177 V

[56] References Cited

U.S. PATENT DOCUMENTS 4,521,747 6/1985 Tahim et al. ............... 331/107 SL
4,574,256 3/1986 Singh ............................. 331/107 SL Primary Examiner—Eugene R. LaRoche
Assistant Examiner—Robert J. Pascal
Attorney, Agent, or Firm—Kirschstein, Ottinger, Israel & Schiffmiller

[57] ABSTRACT

A microwave microstrip oscillator includes a thin dielectric substrate, a Gunn diode mounted within the thickness of the substrate, an annular conductive resonator lying on the surface of the substrate and at least partially surrounding the Gunn diode, and a varactor diode associated with the Gunn diode for controlling the frequency of oscillation of the Gunn diode. A microstrip circuit coupled to the Gunn diode extracts an output power signal at a desired microwave frequency.

6 Claims, 3 Drawing Sheets

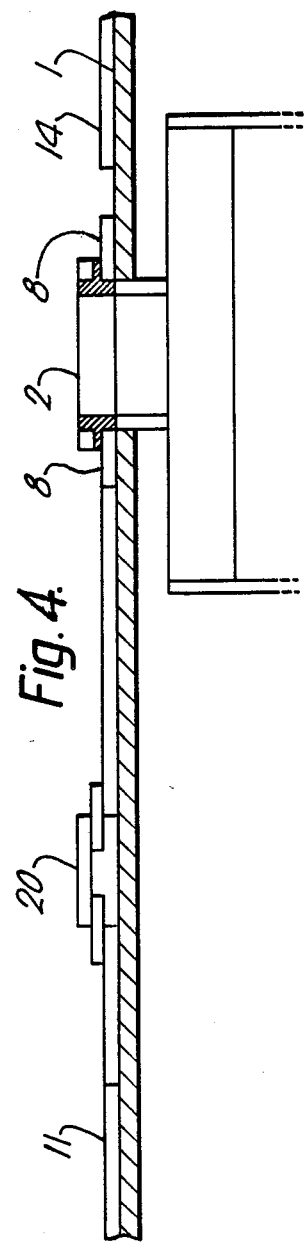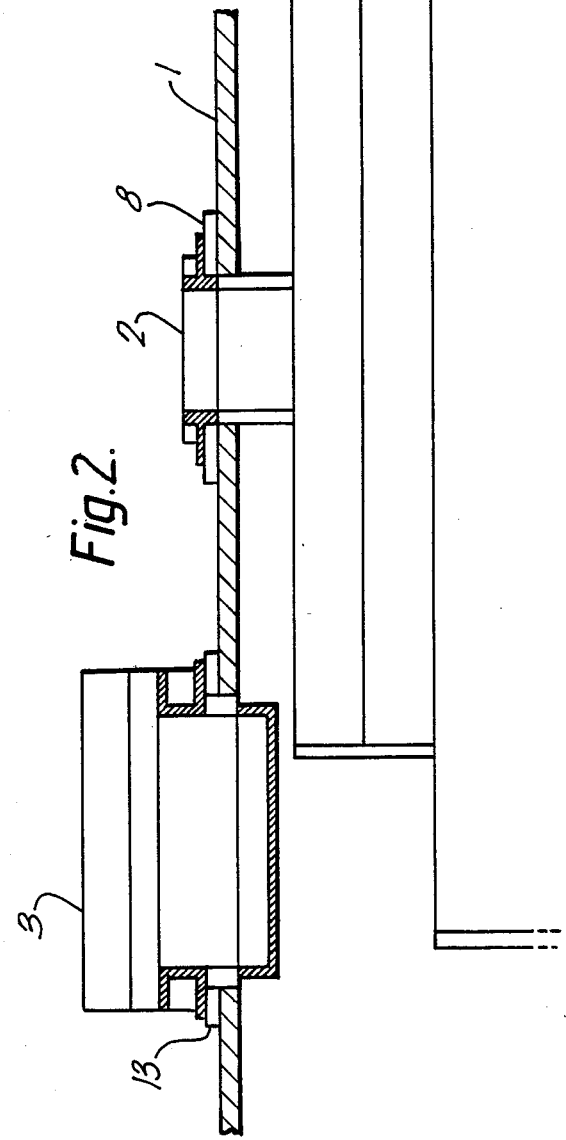

QUARTZ MICROSTRIP GUNN OSCILLATOR

BACKGROUND OF THE INVENTION

This invention relates to microwave oscillators, and more particularly to oscillators which include a Gunn diode as an active element in a resonator circuit. Although it is possible to implement a microwave oscillator of this kind in a waveguide structure, it has proved difficult to produce a satisfactory oscillator in an integrated form on a planar circuit substrate. The planar integrated form is preferred in principle since the techniques which can be used to fabricate it are inherently more reproducable, leading to more controllable and predictable circuits. However, microwave oscillators produced in planar integrated form have not exhibited sufficiently good frequency or power characteristics.

SUMMARY OF THE INVENTION

The present invention seeks to provide an improved microwave oscillator which is fabricated using microstrip line techniques on a planar substrate.

According to this invention, a microwave microstrip oscillator includes a thin dielectric substrate; a Gunn diode mounted within the thickness of the substrate; an annular conductive resonator lying on the surface of the substrate and at least partially surrounding the diode; adjustable capacitive tuning means associated with the diode for controlling the frequency of oscillation of the Gunn diode; and microstrip circuit means coupled to the Gunn diode for extracting an output power signal at a desired microwave frequency.

BRIEF DESCRIPTION OF THE DRAWINGS

The invention is further described by way of example with reference to the accompanying drawings in which:
FIG. 2 is a section on line II—II of FIG. 1;
FIG. 4 is a section on line IV—IV of FIG. 3.

DETAILED DESCRIPTION OF THE PREFERRED EMBODIMENTS

In this invention the Gunn diode is mounted within the thickness of a thin sheet of quartz having a required dielectric property. The electrical paths are laid down onto the upper surface of the substrate using known microstrip technology, a continuous ground plane being provided on the underside of the quartz substrate in order to provide control over the impedance of the transmission lines. The Gunn diode is associated with a very high Q resonator which is also formed on the surface of the substrate, the resonant frequency of the resonator being adjusted by the variable capacitance of a varactor diode associated with it. Like the Gunn diode, the varactor diode is also mounted within the thickness of the substrate. The resulting structure is extremely compact, reproducable and efficient enabling relatively high output power levels to be obtained. It is also capable of exploiting the inherently high Q of a radial disc oscillator geometry.

Figure 1:
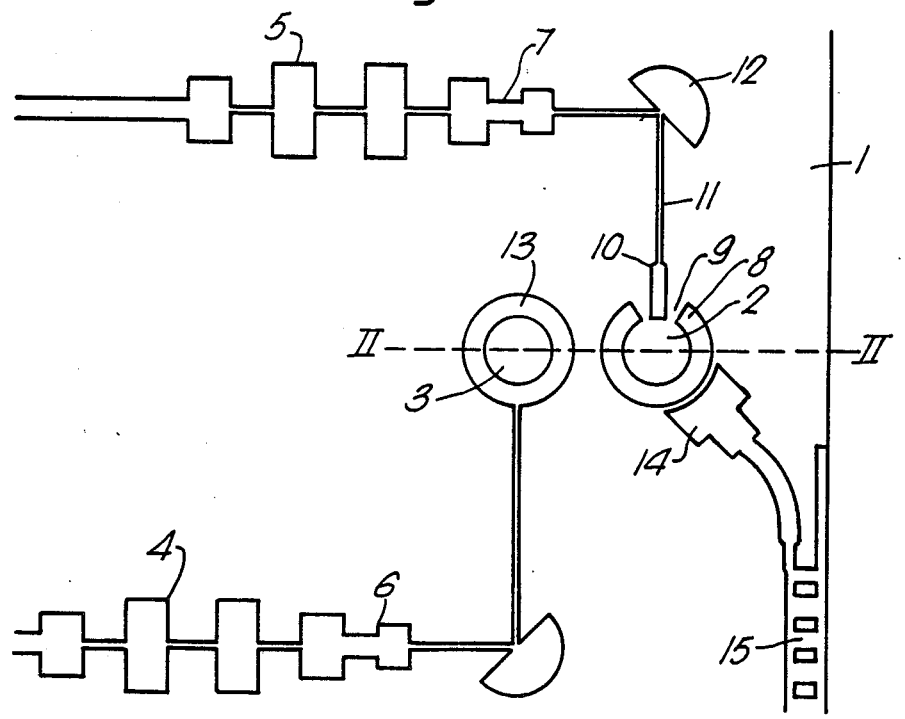
FIG. 1 illustrates a shunt tuned Gunn oscillator.

Referring to FIG. 1, a quartz substrate 1 includes two circular apertures, in one aperture of which is mounted a Gunn diode 2 and in the other aperture of which is mounted a varactor diode 3. The necessary DC bias signals for the vector diode and the Gunn diode are provided via two low pass filter stages 4 and 5. Both stages are provided with matching transformers 6 and 7. In the present embodiment the filter stage is a seven section low pass 0.5 db Tchebyscheff microstrip filter having cut off frequency fc=30 GHz.

In the case of the Gunn diode 2, a radial ring resonant structure is formed by the provision of an annular ring 8 which partly surrounds the Gunn diode 2, a gap 9 being left in which an inductive strip 10 is provided, the inductive strip being linked to the matching transformer 7 via a relatively high impedance line 11 along which a 180° radial sector 12 is positioned so as to establish an RF short circuit at the interface between the inductive line 10,11 and the track 12.

Similarly the varactor diode 3 is provided with a resonant radial disc 13 which functions in a manner similar to the radial disc structure 8. The two diodes 2 and 3 are capacitively coupled via an insulated capacitive overlay which links the two, this overlay not being illustrated.

Output power is extracted from the Gunn diode 2 via an output impedance transformer 14 and a filter 15. The Gunn oscillator 2 has a natural resonant frequency of the order of 47 GHz when operating in conjunction with the varactor diode 3. In order to obtain an output frequency of the order of 94 GHz the oscillator is operated in a second harmonic mode. To this end, the transformer 14 and the filter 15 are carefully dimensioned so as to prevent power at the fundamental frequency passing through to the output port but nevertheless ensuring that power at the second harmonic frequency is passed in a relatively efficient manner. The output line is a 50-Ohm output line and the transformer 14 coupling the Gunn diode 2 to this output line is a matching transformer of λg/4 segments.

FIG. 2 shows a section through the circuit of FIG. 1. The relationships between the diodes 2 and 3 and their respective radial disc structures 8 and 13 can clearly be seen.

Figure 3:
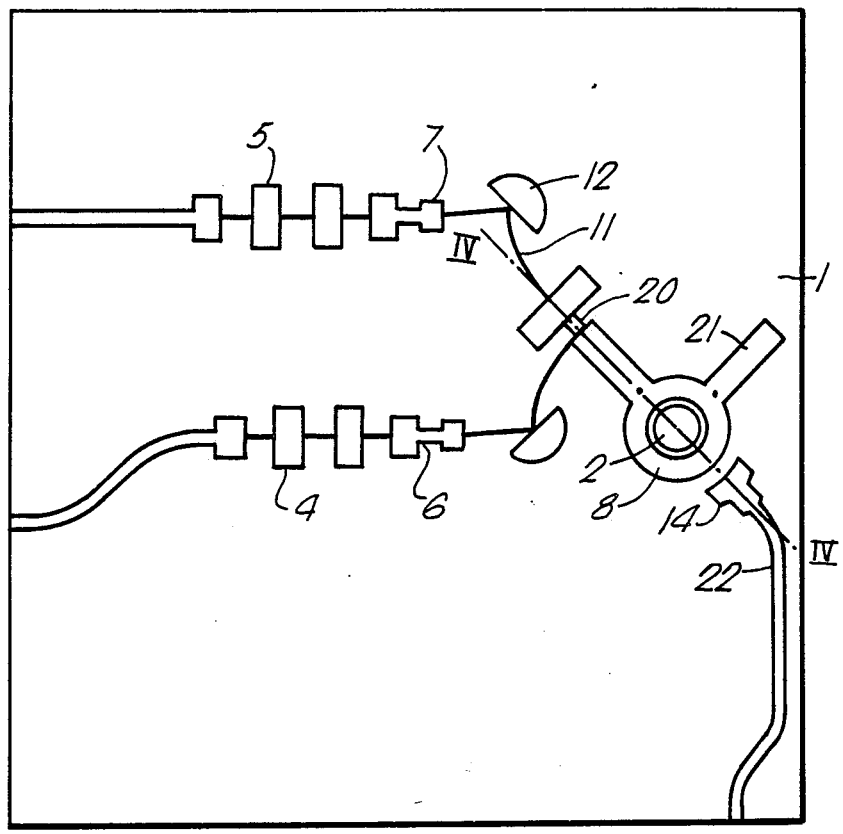
FIG. 3 illustrates a series tuned Gunn osicllator.

FIG. 3 shows a similar circuit to FIG. 1 but in this instance configured as a series tuned Gunn voltage controlled oscillator operating in a fundamental mode of operation. Those parts of the circuit corresponding to FIG. 1 bear like references. It will be seen that in this instance the varactor diode 20 is mounted in the serial path between the transformer 7 and the Gunn diode 2. The varactor diode takes the form of a beam lead device which is suitable for operation at very high frequency. A stub 21 is coupled to the Gunn diode 2 so as to provide mechanical tuning to compensate for device package parasitics. It will be apparent that in this instanced no output filter is required. The output of the Gunn diode 2 is extracted via a matching impedance line 22. In both FIGS. 1 and 2, an additional capacitive coupling pad can be used to couple the Gunn diode 2 to the output transformer stage 14. This coupling pad is not illustrated but in practice it would be insulated from the top surface of the substrate 1.

FIG. 4, as already mentioned is a section through Line IV—IV of FIG. 3 and again shows the relationship between Gunn diode 2, the annular ring 8 and substrate 1.

I claim:
 1. A microwave microstrip oscillator comprising a thin dielectric substrate; a Gunn diode mounted within the thickness of the substrate; an annular conductive resonator lying on the surface of the substrate and at least partially surrounding the Gunn diode; adjustable capacitive tuning means associated with the Gunn diode for controlling the frequency of oscillation of the Gunn diode; and microstrip circuit means coupled to the Gunn diode for extracting an output power signal at a desired microwave frequency.

2. An oscillator as claimed in claim 1, wherein said annular conductive resonator comprises an annular ring having a gap, and wherein an inductive strip is mounted within said gap.

3. An oscillator as claimed in claim 2, wherein said inductive strip is connected via an impedance line to a matching transformer.

4. An oscillator as claimed in claim 3, wherein said adjustable capacitive tuning means comprises a varactor diode.

5. An oscillator as claimed in claim 4, wherein said varactor diode is mounted in a circular opening in said substrate, and wherein DC bias signals for said oscillator and said varactor diode are provided by low pass filters.

6. An oscillator as claimed in claim 3, wherein said adjustable capacitive tuning means comprise a beam lead device.

* * * * *